United States Patent [19]

Sato

[11] Patent Number: 4,574,276
[45] Date of Patent: Mar. 4, 1986

[54] INDICATING SYSTEM

[75] Inventor: Tetsuo Sato, Takasaki, Japan

[73] Assignee: Hitachi, Ltd., Tokyo, Japan

[21] Appl. No.: 473,211

[22] Filed: Mar. 8, 1983

[30] Foreign Application Priority Data

Apr. 16, 1982 [JP] Japan .................................. 57-62438

[51] Int. Cl.[4] ........................................... G08B 21/00
[52] U.S. Cl. ..................................... 340/661; 307/262; 324/133; 328/148; 340/662; 340/663
[58] Field of Search ............... 340/661, 660, 657, 662, 340/636, 663; 324/133; 307/262; 328/146, 148; 361/86, 90; 455/159

[56] References Cited

U.S. PATENT DOCUMENTS 3,663,958  5/1972  Crane .............................. 340/661 X
4,318,092  3/1982  Cowles et al. ....................... 340/636

FOREIGN PATENT DOCUMENTS 210249  3/1968  U.S.S.R. ............................. 324/133

OTHER PUBLICATIONS

"Polarity Indicator"; Elektor (English), vol. 2, No. 7-8, Jul.-Aug. 1976, p. 715.
"In-Circuit dc Current Measurement"; Electronics Industry, vol. 2, No. 11, Dec. 1976, p. 15.

*Primary Examiner*—James L. Rowland
*Assistant Examiner*—Daniel Myer
*Attorney, Agent, or Firm*—Antonelli, Terry & Wands

[57] ABSTRACT

An indicating system includes first and second voltage comparators, first and second output circuits which are respectively supplied with output signals of the first and second voltage comparators, and first and second indicating elements which are connected to a common output terminal of the first and second output circuits. A first input terminal of the first voltage comparator is supplied with a first reference voltage, and a second input terminal thereof is supplied with a control signal. A first input terminal of the second voltage comparator is supplied with a second reference voltage, and a second input terminal thereof supplied with the control signal. When the voltage level of the control signal is higher than the first reference voltage, the first output circuit causes a current of a first polarity to flow to the common output terminal. As a result, the first indicating element is lit up, and the second indicating element is not. When the voltage level of the control signal is lower than the second reference voltage, the second output circuit causes a current of a second polarity to flow to the common output terminal. As a result, the second indicating element is lit up, and the first indicating element is not. When the voltage level of the control signal is intermediate between the first and second reference voltages, neither of the first and second indicating elements are lit up.

13 Claims, 5 Drawing Figures

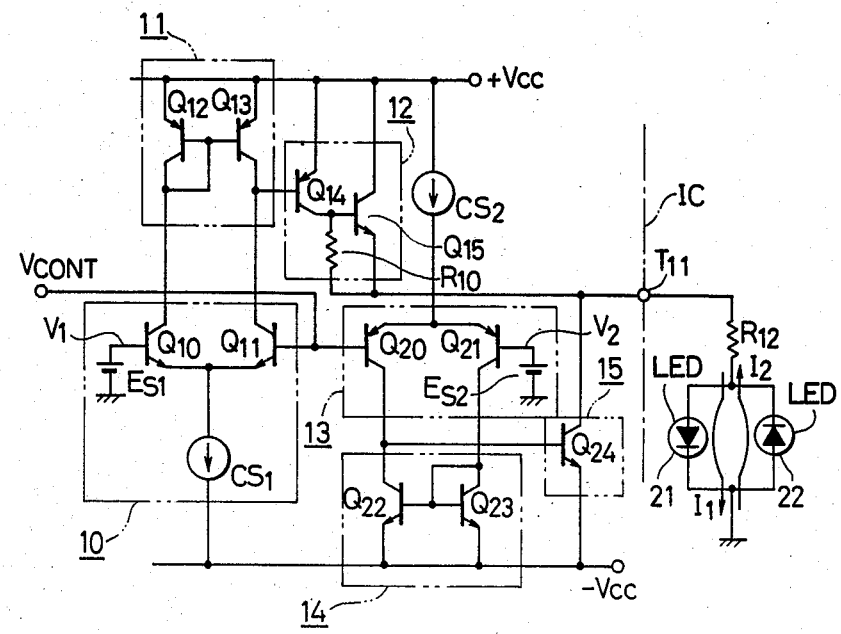

INDICATING SYSTEM

BACKGROUND OF THE INVENTION

The present invention relates to an indicating system for use in indicating the operating status of various electronic equipment.

In audio equipment and the like, indicating lamps are used, not only for the indication of the switching-on of a power supply, but also for indication of tuning accuracy during the reception of a radio broadcast, indication during the play of a record, and the indication of various modes of use in a tape recorder. In this regard, each of the circuit arrangements constituting the electronic equipment as mentioned above is, for the most part, fabricated in the form of a semiconductor integrated circuit. It is therefore desirable that the indicating driver circuit is also formed as a semiconductor integrated circuit and constructed on an identical chip along with an amplifier and other circuit elements of the equipment.

The indicating driver circuit illustrated in FIG. 1 was developed by me prior to the present invention, and it is to this type of circuit that the advantages of the present invention are particularly applicable, as will now be described. When the base of an NPN transistor $Q_1$ is supplied with a lighting signal $V_{in}$, this transistor $Q_1$ turns to the "on" state. Then, a voltage drop develops across a load resistor $R_1$, so that a PNP transistor $Q_2$ is supplied with a base voltage $V_{BE2}$ and is turned to the "on" state. As a result, current flows along a path which consists of a $+V_{CC}$ voltage source, the transistor $Q_2$, a bias resistor $R_2$, an output terminal $T_1$, a resistor $R_3$, a light emitting diode 1 and ground. In consequence, a voltage drop develops across the bias resistor $R_2$, and it supplies a base voltage $V_{BE3}$ to a transistor $Q_3$. The transistor $Q_3$ is turned to the "on" state, and a driving current flows along a path consisting of the $+V_{CC}$ voltage source, transistor $Q_3$, output terminal $T_1$, resistor $R_3$, light emitting diode 1 and ground, so that the light emitting diode 1 is lit up. The transistor $Q_2$ and the bias resistor $R_2$ maintains the transistor $Q_3$ in the conductive state so long as the lighting signal $V_{in}$ is received.

With the circuit arrangement as described above, however, one external connection terminal, namely, output terminal $T_1$ is required for lighting up each light emitting diode 1. Accordingly, in a case where different modes of operation of the equipment are selected by turning a knob 2 counterclockwise and clockwise between successive switch positions as illustrated in FIG. 2, two indicating driver circuits must be provided in order to light up the two light emitting diodes 1 and 1'. This signifies the necessity of providing two external connection terminals for the purpose of lighting up the two indicating lamps, and forms a factor of increased cost in the case of fabricating the semiconductor integrated circuit which includes these two indicating driver circuits. Moreover, with the prior art circuit arrangement, even when two separate indicating driver circuits are provided, they can indicate only the two modes, in one of which the first indicating lamp is lit up and in the other the second indicating lamp is lit up. That is, in the presence of a plurality of modes to be selected, indicating lamp-lighting circuits must be provided in the same number as the number of the modes to be indicated, which is very inconvenient.

SUMMARY OF THE INVENTION

It is therefore an object of the present invention to provide an indicating system in which indicating lamps and driver circuits are connected by a single external connection terminal and which can indicate a plurality of modes.

In accordance with the present invention, an indicating system is provided having first and second voltage comparators which are supplied, on the one hand, with respective first and second reference voltages of different value, and on the other hand, with an indicating control signal which is provided thereto in common. A first output circuit is connected to the output of the first voltage comparator and causes current at a first polarity to be applied to an output terminal when the applied indicating control signal is higher than the first reference voltage. A second output circuit is connected to the output of the second voltage comparator and causes current at a second polarity to be applied to the output terminal when the applied indicating control signal is lower than the second reference voltage. A pair of light emitting elements having unidirectional current conduction characteristics, such as light emitting diodes or lamps in series with diodes, are connected in a parallel inverse arrangement to the output terminal, so that one light emitting element is energized by the current at the first polarity and the other light emitting element is energized by the current at the second polarity.

A particular feature of the present invention resides in the fact that, when the applied indicating control signal is higher in level than both the first and second reference voltages, one of the light emitting elements is energized, and when the applied indicating control signal is lower in level than both the first and second reference voltages, the other light emitting element is energized. However, when the applied indicating control signal is at a level between the first and second reference voltages, neither light emitting element is energized, thus providing an indication of three different operating conditions.

BRIEF DESCRIPTION OF THE DRAWINGS

FIG. 3 is a schematic circuit diagram of an indicating system, showing an embodiment of the present invention;

FIG. 4 is a schematic circuit diagram of an indicating circuit which can adjust brightness; and FIG. 5 is a schematic circuit diagram of an indicating circuit, showing an example in the case where light emitting elements other than light emitting diodes are used.

DESCRIPTION OF THE PREFERRED EMBODIMENTS

Figure 1:
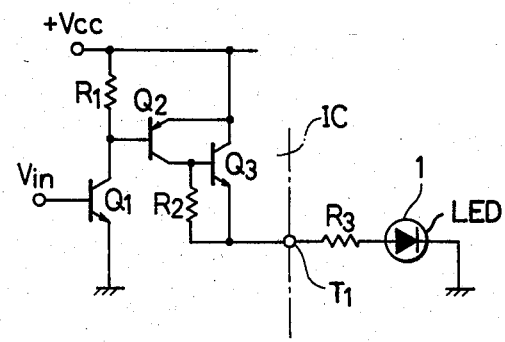
FIG. 1 is a schematic circuit diagram showing an example of an indicating driver circuit which I have developed prior to the present invention.
Figure 2:
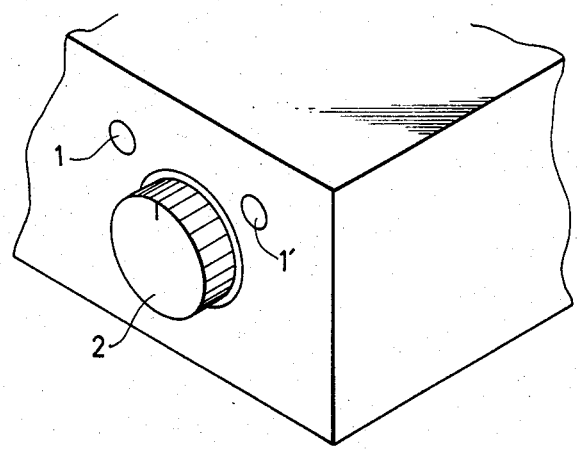
FIG. 2 is a perspective view of the pertinent portions of an electronic apparatus, showing an example of the external arrangement of an indicating system.

Referring now to FIG. 3, an embodiment of an indicating system to which the present invention is applied will be described. The part of the system intended to be constructed in the form of a semiconductor integrated circuit is located to the left of the line denoted by IC.

More specifically, a first voltage comparator 10, a first load circuit 11, a first output circuit 12, a second voltage comparator 13, a second load circuit 14, and a second output circuit 15 are formed within the monolithic semiconductor integrated circuit (IC). On the other hand, two indicating lamps 21 and 22 which are alternately lit up in correspondence with the polarity change of a current supplied to terminal $T_{11}$ are disposed outside the IC and are connected to the common output terminal $T_{11}$ of the IC through an external resistor $R_{12}$. The ends of the two indicating lamps 21 and 22 remote from the external resistor $R_{12}$ are connected to ground potential.

The NPN transistors $Q_{10}$ and $Q_{11}$ along with reference voltage source $E_{S1}$ and constant current source $CS_1$ constitute the first voltage comparator 10; the PNP transistors $Q_{12}$ and $Q_{13}$ constitute a current mirror circuit, which operates as the load circuit 11 for the first voltage comparator 10; and a PNP transistor $Q_{14}$ and an NPN transistor $Q_{15}$ along with bias resistor $R_{10}$ constitute the first output circuit 12. The PNP transistors $Q_{20}$ and $Q_{21}$ along with reference voltage source $E_{S2}$ and constant current source $CS_2$ constitute the second voltage comparator 13; the NPN transistors $Q_{22}$ and $Q_{23}$ constitute a current mirror circuit, which operates as the load circuit 14 for the second voltage comparator 13; and a NPN transistor $Q_{24}$ constitutes the second output circuit 15.

Reference voltage sources $E_{S1}$ and $E_{S2}$, which are different in level from each other, are respectively connected to the base of the transistors $Q_{10}$ and that of the transistor $Q_{21}$. Letting $V_1$ denote the reference voltage of the source $E_{S1}$ and $V_2$ denote the reference voltage of the source $E_{S2}$, both are held in the relation $V_1 > V_2$. The bases of the transistors $Q_{11}$ and $Q_{20}$ are supplied with a control signal $V_{CONT}$ in common. The voltage level of the control signal $V_{CONT}$ can change in three stages: $V_{CONT} > V_1 > V_2$, $V_1 > V_{CONT} > V_2$ and $V_1 > V_2 > V_{CONT}$.

There will now be described circuit operations in the case where the voltage levels of the control signal $V_{CONT}$ and the bias voltage sources $E_{S1}$, $E_{S2}$ are in the relationship $V_{CONT} V_1 > V_2$.

In this case, the transistor $Q_{11}$ turns to the "on" state, and the transistor $Q_{10}$ is in the "off" state. Accordingly, no current flows through the transistor $Q_{12}$. Current flows from a $+V_{CC}$ voltage source to ground via the emitter-base path of the transistor $Q_{14}$, the transistor $Q_{11}$ and the constant current circuit $CS_1$. Then, the transistor $Q_{14}$ turns to the "on" state, so that current flows through a resistor $R_{10}$ to supply the transistor $Q_{15}$ with a bias voltage. Therefore, current $I_1$ flows along a path consisting of the $+V_{CC}$ voltage source, transistor $Q_{15}$, output terminal $T_{11}$, resistor $R_{12}$, light emitting diode 21 and ground potential, and the light emitting diode 21 is lit up.

Here, in the second voltage comparator 13, since the transistors $Q_{20}$ and $Q_{21}$ are of the PNP type and the present condition is $V_{CONT} > V_1 > V_2$, the transistor $Q_{21}$ turns to the "on" state. Accordingly, current flows along a path consisting of the $+V_{CC}$ voltage source, the constant current circuit $CS_2$, the transistor $Q_{21}$, the transistor $Q_{23}$ and the $-V_{CC}$ voltage source. However, the transistor $Q_{20}$ is in the "off" state, so that the transistor $Q_{24}$ is supplied with no bias voltage and is held in the "off" state. Thus, in the case of $V_{CONT} > V_1 > V_2$, only the first driver circuit 12 operates, the forward current $I_1$ flows through the light emitting diode 21, and only this light emitting diode 21 is lit up.

As can be seen from the foregoing description, in the case of $V_{CONT} > V_1 > V_2$, the first load circuit 11 and the first output circuit 12 supply a current $I_1$ of first polarity for energizing the first light emitting diode 21 to the two parallel inverse connected diodes 21 and 22 in response to the output signal of the first voltage comparator 10. On the other hand, the second load circuit 14 and the second output circuit 15 do not supply a current for energizing the second light emitting diode 22 to the parallel inverse connection at this time.

Next, with the switching of the control voltage $V_{CONT}$ to the next lower level, circuit operations in the case of $V_1 > V_{CONT} > V_2$ will be described.

In this case, the transistor $Q_{10}$ turns to the "on" state, and the transistor $Q_{11}$ is in the "off" state. Current flows along a path consisting of the $+V_{CC}$ voltage source, transistor $Q_{12}$, transistor $Q_{10}$, constant current circuit $CS_1$ and the $-V_{CC}$ voltage source. As a result, the emitter-collector voltage $V_{CE}$ of the transistor $Q_{13}$ becomes substantially null, and the collector voltage thereof rises so as to approximate the voltage level of the $+V_{CC}$ voltage source. This voltage change signifies that the base potential of the transistor $Q_{14}$ approximates the emitter potential thereof, and the transistor $Q_{14}$ turns to the "off" state. Also, the transistor $Q_{15}$ turns to the "off" state. Accordingly, the current $I_1$ previously flowing from the $+V_{CC}$ voltage source to the light emitting diode 21 via the first output circuit 12 is cut off. The light emitting diode 21 is switched from the lit state to the extinguished state.

Here, in the second voltage comparator 13, owing to the condition of $V_{CONT} > V_2$, the base voltages of the transistors $Q_{20}$ and $Q_{21}$ do not basically differ from those in the case of $V_{CONT} > V_1 > V_2$. Accordingly, the second voltage comparator 13, second current mirror circuit 14 and second output circuit 15 do not operate. Thus, in the case of $V_1 > V_{CONT} > V_2$, no current flows through the light emitting diode 21 or 22, and neither is lit up. As can be seen from this description, in the case of $V_1 > V_{CONT} > V_2$, the first load circuit 11 as well as the first output circuit 12 and the second load circuit 14 as well as the second output circuit 15 stop their supply of the two currents $I_1$ and $I_2$ in response to the output signal of the first voltage comparator 10 and the output signal of the second voltage comparator 13, respectively.

Next, with the further switching of the control voltage $V_{CONT}$ to the next lower level, circuit operations in the case of $V_1 > V_2 > V_{CONT}$ will be described.

In this case the respective circuit operations of the first voltage comparator 10, first current mirror circuit 11 and first output circuit 12 are similar to those in the case of the condition $V_1 > V_{CONT} > V_2$.

When the second voltage comparator 13 is referred to, it is seen that the transistor $Q_{20}$ turns to the "on" state. Since, however, the transistor $Q_{21}$ is in the "off" state, no current flows through the transistor $Q_{23}$. For this reason, the transistor $Q_{22}$ is in the "off" state. Accordingly, current flowing from the $+V_{CC}$ voltage source through the constant current circuit $CS_2$ and transistor $Q_{20}$ flows to the $-V_{CC}$ voltage source through the base and emitter of the transistor $Q_{24}$. Thus, the transistor $Q_{24}$ is supplied with a base current and turns to the "on" state.

As a result, the current $I_2$ flows along a current path which consists of the ground line, light emitting diode 22, resistor $R_{12}$, output terminal $T_{11}$, transistor $Q_{24}$ and the $-V_{CC}$ voltage source. The light emitting diode 22 is lit up, whereas the other light emitting diode 21 is not lit up. In other words, the first load circuit 11 and the first output circuit 12 stop their supply of the current I₁ of the first polarity to the parallel inverse connection in response to the output signal of the first voltage comparator 10, whereas the second load circuit 14 and the second output circuit 15 supply the current I₂ of the second polarity to the parallel inverse connection in response to the output signal of the second voltage comparator 13.

As described above, the three types of indication, i.e., the indication in which only the light emitting diode 21 is lit up, the indication in which neither the light emitting diode 21 nor 22 is lit up, and the indication in which only the light emitting diode 22 is lit up, are effected by switching the voltage level of the control signal $V_{CONT}$ in three states.

The foregoing indicating operations are performed in such a way that the directions of the currents flowing through the respective light emitting diodes 21 and 22 are changed by utilizing the current rectification characteristics of these light emitting diodes. As regards the light emitting diodes 21 and 22, accordingly, a modification to be described below is possible. The light emitting diodes 21 and 22 sometimes differ in brightness, depending upon the color to be emitted. In this case, resistors $R_{21}$ and $R_{22}$ for adjusting the currents are individually disposed in series with the respective diodes, as shown in FIG. 4. The quantity of current is decreased for the light emitting diode which is bright and prominent, and a larger quantity of current is caused to flow through the light emitting diode which is relatively dark. Thus, the intensity of light to be emitted from the light emitting diodes 21 and 22 can be adjusted at will, and the degrees of brightness can be brought into agreement.

Although, in the foregoing embodiments, light emitting diodes are used as the light emitting elements, the invention is not so restricted. By way of example, a diode $D_1$ and an indicating lamp $L_1$, and a diode $D_2$ and an indicating lamp $L_2$ may be connected in series as shown in FIG. 5. In this way, the indicating lamps $L_1$ and $L_2$ can be selectively lit up owing to the current rectifying characteristics of the diodes $D_1$ and $D_2$.

As set forth above, according to the present invention, the voltage level of a control signal is changed in three stages, where a first indicating lamp and a second indicating lamp can be selectively lit up, and also, both can be put out, so that three different modes corresponding to the voltage levels of the control signal can be indicated. Moreover, the lighting-up and putting-out of the indicating lamps are effected through a single common output terminal, so that production costs can be sharply curtailed in the case of fabricating the indicating system in the form of a semiconductor integrated circuit.

While I have shown and described several embodiments in accordance with the present invention, it is understood that the same is not limited thereto but is susceptible of numerous changes and modifications as known to a person skilled in the art, and I therefore do not wish to be limited to the details shown and described herein but intend to cover all such changes and modifications as are obvious to one of ordinary skill in the art.

What is claimed is:

1. An indicating system comprising:
   (a) a first voltage comparator having a first input terminal connected to receive a first reference voltage and a second input terminal connected to receive a control signal;
   (b) a second voltage comparator having a first input terminal connected to receive a second reference voltage and a second input terminal connected to receive said control signal;
   (c) first output circuit means having an input terminal connected to an output terminal of said first voltage comparator for producing a current of a first polarity at a common output terminal when the voltage level of said control signal is higher than said first reference voltage;
   (d) second output circuit means having an input terminal connected to an output terminal of said second voltage comparator for producing a current of a second polarity at said common output terminal when the voltage level of said control signal is lower than said second reference voltage;
   (e) a first indicating device having a unidirectional current characteristic, one end of which is connected to said common output terminal so as to allow the current of the first polarity to flow therethrough and to prevent the current of the second polarity from flowing therethrough; and
   (f) a second indicating device having a unidirectional current characteristic, one end of which is connected to said common output terminal so as to allow the current of the second polarity to flow therethrough and to prevent the current of the first polarity from flowing therethrough.

2. An indicating system according to claim 1, wherein said first reference voltage is higher in level than said second reference voltage.

3. An indicating system according to claim 2, wherein said first output circuit means and said second output circuit means are connected in series between a positive supply voltage source and a negative supply voltage source, the other ends of said first and second indicating devices being connected to ground potential, and the point of connection of said first and second output circuit means being connected to said common output terminal.

4. An indicating system according to claim 3, further comprising:
   (g) a first load connected between said output terminal of said first voltage comparator and said positive supply voltage source; and
   (h) a second load connected between said output terminal of said second voltage comparator and said negative supply voltage source.

5. An indicating system according to claim 4, wherein said first voltage comparator includes a pair of differential NPN transistors, said second voltage comparator includes a pair of differential PNP transistors, said first output circuit means including a PNP transistor which has its emitter connected to said positive supply voltage source, its base connected to said first load and its collector connected to said common output terminal, and said second output circuit means including a NPN transistor which has its emitter connected to said negative supply voltage source, its base connected to said second load and its collector connected to said common output terminal.

6. An indicating system according to claim 5, wherein said first indicating device is a first light emitting diode, while said second indicating device is a second light emitting diode, and these first and second light emitting diodes are connected in a parallel inverse relationship.

7. An indicating system according to any of claims 1 to 5, wherein said first and second voltage comparators and said first and second output circuit means are formed within a monolithic semiconductor integrated circuit, and said first and second indicating elements are disposed outside said monolithic semiconductor integrated circuit.

8. An indicating system for producing multi-mode indications in response to an applied control signal; comprising:
   (a) first and second reference voltage sources providing first and second reference voltages which are of different level with respect to each other;
   (b) first voltage comparator means connected to receive said first reference voltage and said applied control signal for producing a first drive current of first polarity when said applied control signal is greater in level than said first reference voltage;
   (c) second voltage comparator means connected to receive said second reference voltage and said applied control signal for producing a second drive current of second polarity when said applied control signal is less in level than said second reference voltage;
   (d) a pair of unidirectional current conducting indicating devices connected in a parallel inverse relationship; and
   (e) means for applying said first and second drive currents to said pair of indicating devices.

9. An indicating system according to claim 8, wherein said first reference voltage is higher in level than said second reference voltage.

10. An indicating system according to claim 8, wherein said first and second indicating devices are light emitting diodes.

11. An indicating system comprising:
   (a) a first voltage comparator having a first input terminal connected to receive a first reference voltage and a second input terminal connected to receive a control signal;
   (b) a second voltage comparator having a first input terminal connected to receive a second reference voltage and a second input terminal connected to receive said control signal;
   (c) first output switching means having a control input terminal connected to an output terminal of said first voltage comparator, a first terminal connected to a first potential and a second terminal connected to a common output terminal, the electrical condition between said first terminal and said second terminal being controlled to either one of an "on" state or an "off" state by a signal level at said output terminal of said first voltage comparator;
   (d) second output switching means having a control input terminal connected to an output terminal of said second voltage comparator, a first terminal connected to said common output terminal and a second terminal connected to a second potential, the electrical condition between said first terminal and said second terminal being controlled to either one of an "on" state or an "off" state by a signal level at said output terminal of said second voltage comparator;
   (e) a first indicating device having a unidirectional current characteristic, one end of which is connected to said common output terminal, another end of which is connected to a third potential so as to allow a current of a first polarity to flow therethrough and to prevent a current of a second polarity from flowing therethrough;
   (f) a second indicating device having a unidirectional current characteristic, one end of which is connected to said common output terminal, another end of which is connected to said third potential so as to allow said current of said second polarity to flow therethrough and to prevent said current of said first polarity from flowing therethrough; and
   (g) resistive means connected between said common output terminal and said one end of each of said first and second indicating devices.

12. An indicating system according to claim 11, wherein said resistive means comprises a first resistor connected between said common output terminal and said one end of said first indicating device and a second resistor connected between said common output terminal and said one end of said second indicating device, the resistance values of said first and said second resistor being selected so as to bring the degree of brightness of said first and said second indicating devices into agreement.

13. An indicating system according to claim 12, wherein said first reference voltage is higher in level than said second reference voltage.

* * * * *